United States Patent
Wang

(10) Patent No.: US 10,571,684 B2
(45) Date of Patent: Feb. 25, 2020

(54) MICRO-MIRROR ARRAY HAVING PILLARS WHICH FORM PORTIONS OF ELECTRICAL PATHS BETWEEN MIRROR ELECTRODES AND MIRRORS

(71) Applicant: Boe Technology Group Co., Ltd., Beijing (CN)

(72) Inventor: Shang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 629 days.

(21) Appl. No.: 15/107,586

(22) PCT Filed: Dec. 11, 2015

(86) PCT No.: PCT/CN2015/097108
§ 371 (c)(1),
(2) Date: Jun. 23, 2016

(87) PCT Pub. No.: WO2017/012253
PCT Pub. Date: Jan. 26, 2017

(65) Prior Publication Data
US 2018/0196254 A1    Jul. 12, 2018

(30) Foreign Application Priority Data
Jul. 17, 2015 (CN) .......................... 2015 1 0421259

(51) Int. Cl.
G02B 26/08    (2006.01)
G02B 26/10    (2006.01)
(Continued)

(52) U.S. Cl.
CPC ....... *G02B 26/0841* (2013.01); *H04N 9/3126* (2013.01); *B81B 3/0021* (2013.01);
(Continued)

(58) Field of Classification Search
CPC ...... G02B 6/357; G02B 26/0833–0866; G02B 26/101; G02B 26/105; G03B 21/142;
(Continued)

(56) References Cited

U.S. PATENT DOCUMENTS 6,850,352 B1    2/2005  Childers
7,468,839 B2   12/2008  Lee et al.
(Continued)

FOREIGN PATENT DOCUMENTS

CN    2421510    2/2001
CN    1397816    2/2003
(Continued)

OTHER PUBLICATIONS

International Search Report and Written Opinion from PCT/CN15/097108 dated Apr. 21, 2016.
Office Action from China Application No. 201510421259.8 dated Dec. 5, 2016.

*Primary Examiner* — Ryan S Dunning
(74) *Attorney, Agent, or Firm* — Calfee, Halter & Griswold LLP

(57) ABSTRACT

The present disclosure discloses a micro-mirror array, and a backlight module and a display device using the same. Each reflection mirror in the micro-mirror array comprises a first axis of deflection and a second axis of deflection perpendicular to the first axis of deflection, and a deflection angle of the reflection mirror is controlled individually and continuously. The backlight module comprises a light source, a micro-mirror array and a control unit. The control unit adjusts a deflection angle of each reflection mirror in the micro-mirror array in response to a backlight control signal, so that depending on the backlight control signal, the micro-mirror array reflects light emitted from the light source evenly to an entire surface of the display screen or converges the light to one or more areas of the display screen.

5 Claims, 4 Drawing Sheets

(51) Int. Cl.
  *B81B 7/04* (2006.01)
  *G03B 21/28* (2006.01)
  *H04N 9/31* (2006.01)
  *G02B 6/35* (2006.01)
  *B81B 3/00* (2006.01)
  *H04N 5/74* (2006.01)
(52) U.S. Cl.
  CPC ... *B81B 2203/0361* (2013.01); *B81B 2203/04* (2013.01); *B81B 2207/091* (2013.01); *G02B 6/357* (2013.01); *G02B 26/101* (2013.01); *G02B 26/105* (2013.01); *G03B 21/28* (2013.01); *H04N 5/7458* (2013.01)
(58) Field of Classification Search
  CPC ..... G03B 21/28; B81B 3/0021; B81B 3/0062; B81B 7/0003; B81B 7/008; B81B 7/02; B81B 2201/04–047; B81B 2203/0109; B81B 2203/0145–0172; B81B 2203/019; B81B 2203/04; B81B 2203/058; B81B 2207/091; H04N 5/7458; H04N 2005/7466
  USPC ..... 250/230, 234; 347/255–260; 353/39, 98, 353/99; 359/198.1–200.3, 200.6–200.8, 359/202.1, 212.1–215.1, 220.1, 359/221.2–221.4, 223.1–226.2, 298, 321, 359/871, 872, 876, 877; 385/15–18; 398/12, 19, 45
  See application file for complete search history.

(56) References Cited

U.S. PATENT DOCUMENTS

| | | | |
|---|---|---|---|
| 8,334,946 | B2 | 12/2012 | Karakawa |
| 2004/0004775 | A1 | 1/2004 | Turner |
| 2008/0013147 | A1* | 1/2008 | Pan .................... G02B 26/0841 359/226.1 |
| 2008/0100899 | A1* | 5/2008 | Shimokawa ............ B81B 3/004 359/225.1 |
| 2010/0291410 | A1 | 11/2010 | Novotny et al. |
| 2012/0236379 | A1* | 9/2012 | da Silva ................ G01S 7/4817 359/200.8 |

FOREIGN PATENT DOCUMENTS

| | | |
|---|---|---|
| CN | 2639915 | 9/2004 |
| CN | 2687711 | 3/2005 |
| CN | 1620626 | 5/2005 |
| CN | 1902677 | 1/2007 |
| CN | 201081152 | 7/2008 |
| CN | 101546104 | 9/2009 |
| CN | 102354052 | 2/2012 |
| CN | 103048782 | 4/2013 |
| CN | 103323946 | 9/2013 |
| CN | 10336363 | 10/2013 |
| CN | 103399402 | 11/2013 |
| CN | 104760921 | 7/2015 |
| CN | 104932098 | 9/2015 |
| JP | 2004302121 | 10/2004 |

* cited by examiner

US 10,571,684 B2

MICRO-MIRROR ARRAY HAVING PILLARS WHICH FORM PORTIONS OF ELECTRICAL PATHS BETWEEN MIRROR ELECTRODES AND MIRRORS

CROSS-REFERENCE TO THE RELATED APPLICATIONS

The present application is the U.S. national phase entry of PCT/CN2015/097108, with an international filing date of Dec. 11, 2015, which claims the benefit to Chinese Patent Application No. 201510421259.8, filed on Jul. 17, 2015, the entire disclosures of which are incorporated herein by reference.

TECHNICAL FIELD

The present disclosure relates to the technical field of display, and particularly to a micro-mirror array and a backlight module and a display device using the same.

BACKGROUND

A micro-mirror array is a Micro-electromechanical Systems (MEMS) device, and its basic principle is using a driving force (e.g., an electrostatic force or magnetic force) to enable a movable micro-mirror surface to rotate or translate, thereby changing a propagation direction or phase of input light. The micro-mirror array has already been extensively used in various fields in optical communications such as light exchange, spectral analysis instrument and projection imaging. Especially, application of the micro-mirror array to a projector is based on a front projection arrangement manner, and is an application different from the rear projection field to which large screen and flat panel display relate.

In the technical field of liquid crystal display, adjustment of backlight energy and direction is in process of research. It is favorable in certain application occasions (e.g., large-screen display) to focus backlight intensity to one area to provide super-high brightness in a local area. In the prior art, the micro-mirror array has not yet been used to provide a liquid crystal display with backlight having adjustable intensity distribution.

SUMMARY

An object of the present disclosure is to provide a micro-mirror array, and a backlight module and a display device using the same.

According to a first aspect of the present disclosure, there is provided an electrostatically-driven deflection type micro-mirror array, comprising a substrate; and a plurality of micro-mirror units formed on the substrate, each of the plurality of micro-mirror units comprising: a reflection mirror deflectable about a first axis of deflection and a second axis of deflection perpendicular to the first axis of deflection; a frame supporting the reflection mirror by virtue of a first hinge and a second hinge, the first hinge and the second hinge defining the first axis of deflection; a first pillar and a second pillar supporting the frame via a third hinge and a fourth hinge respectively, the third hinge and the fourth hinge defining the second axis of deflection; a first electrode pair comprising a first drive electrode and a second drive electrode, the first drive electrode and the second drive electrode being symmetrical about the projection of the first axis of deflection on the substrate; a second electrode pair comprising a third drive electrode and a fourth drive electrode, the third drive electrode and the fourth drive electrode being symmetrical about the projection of the second axis of deflection on the substrate; and a reflection mirror electrode electrically connected with the reflection mirror via the first pillar and the second pillar; wherein an electrostatic field is formed between the first electrode pair and the reflection mirror to enable the reflection mirror to deflect about the first axis of deflection, and an electrostatic field is formed between the second electrode pair and the reflection mirror to enable the reflection mirror to deflect about the second axis of deflection; wherein a deflection angle of the reflection mirror of each of the plurality of micro-mirror units is controlled individually and continuously. Favorably, the micro-mirror array may provide flexible adjustment of the direction of the reflected light.

In an embodiment, the micro-mirror array may further comprise an insulating layer formed on the substrate and providing insulation between the reflection mirror electrode and the first electrode pair and the second electrode pair. The insulating layer may reduce interference between electrodes.

In an embodiment, each of the plurality of micro-mirror units may further comprise guard electrodes arranged surrounding the first electrode pair and the second electrode pair, the guard electrodes being applied the same drive voltage as the reflection mirror electrode.

In an embodiment, the reflection mirror, the first, second, third and fourth hinges and the frame may be integrally formed of aluminum.

In an embodiment, the reflection mirror may be square. Such reflection mirror may achieve an efficient use of a gap between micro-mirror units and therefore increases its reflection area.

According to a second aspect of the present disclosure, there is provided a backlight module of a display panel, comprising: a light source; a micro-mirror array comprising a plurality of micro-mirror units, each of the plurality of micro-mirror units comprising a reflection mirror deflectable about a first axis of deflection and a second axis of deflection perpendicular to the first axis of deflection; and a control unit configured to adjust a deflection angle of each reflection mirror in the micro-mirror array in response to a backlight control signal, so that depending on the backlight control signal, the micro-mirror array reflects light emitted from the light source evenly to an entire surface of the display screen or converges the light to one or more areas of the display screen. It is favorable that the backlight module may control distribution of the backlight energy (intensity), and provides backlight output having super-high brightness in one or more local areas.

In an embodiment, the micro-mirror array may be the electrostatically-driven deflection type micro-mirror array in the first aspect of the present disclosure.

In an embodiment, the control unit may comprise: a deflection angle determining unit configured to determine a respective deflection angle for each reflection mirror in the micro-mirror array according to a target area to be illuminated on the display screen which is indicated by the backlight control signal, the deflection angle comprising a first deflection component with respect to the first axis of deflection and a second deflection component with respect to the second axis of deflection; an angle-drive voltage converting unit configured to convert the respective first deflection component and the respective second deflection component for each reflection mirror respectively into drive voltage values for driving the first electrode pair and the second electrode pair corresponding to the reflection mirror;

and a micro-mirror array driver configured to apply respective drive voltages respectively to the first electrode pair and second electrode pair corresponding to each reflection mirror according to the drive voltage values converted by the angle-drive voltage converting unit. Especially, as compared with a solution of electrically adjusting light intensity of the light source of the backlight module, the reflection mirror in the micro-mirror array deflects mechanically, and therefore does not affect a service life of the light source and causes the service life of the backlight module longer.

In an embodiment, the same reference voltage is applied to all reflection mirror electrodes in the micro-mirror array. In each micro-mirror unit of the micro-mirror array, the first drive electrode is applied a first drive voltage, and the second drive electrode is applied a drive voltage in an opposite phase to the first drive voltage. The first drive voltage, as a function of the first deflection component, is proportional to the reference voltage. The third drive electrode is applied a second drive voltage, and the fourth drive electrode is applied a drive voltage in an opposite phase to the second drive voltage. The second drive voltage, as a function of the second deflection component, is proportional to the reference voltage.

In an embodiment, each of the micro-mirror units may have respective two digital-analog converters and respective two voltage inverters. One of the two digital-analog converters provides the first drive voltage for the first drive electrode, and the other provides the second drive voltage for the third drive electrode. One of the two voltage inverters provides the second drive electrode with the drive voltage in an opposite phase to the first drive voltage, and the other provides the fourth drive electrode with the drive voltage in an opposite phase to the second drive voltage.

In an embodiment, the light source may be a parallel light source. An optical efficiency of the backlight module may be improved by using the parallel light source.

In an embodiment, the backlight module may further comprise a projection lens arranged on a reflection optical path of the micro-mirror array to diverge the reflected light from the micro-mirror array to match a size of the display screen. Due to divergence of light performed by the projection lens, the reflection optical path may be shortened, thereby causing reduction of the size of the backlight module.

In an embodiment, the backlight module may further comprise a light-scattering plate arranged on a rear side of the display screen. The light-scattering plate may improve properties of light finally irradiated to the display screen, e.g., provide even brightness.

According to a third aspect of the present disclosure, there is provided a display device comprising the backlight module as described in the second aspect of the present disclosure.

Advantages, features and other aspects of the present disclosure will be apparent according to embodiments descried below and illustrated with reference to embodiments described hereunder.

DETAILED DESCRIPTION

Various embodiments of the present disclosure will be described in detail below in conjunction with figures.

Figure 1:
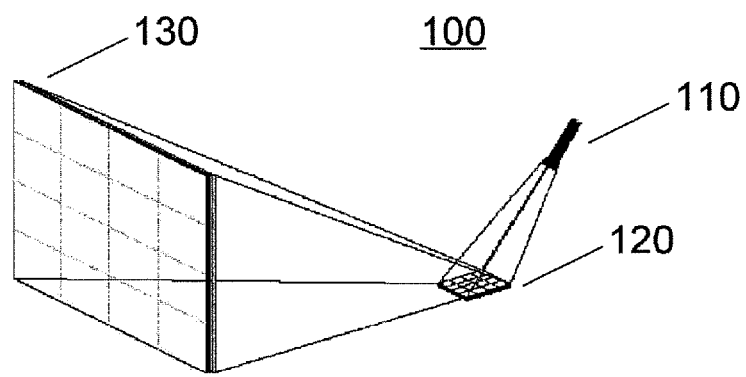
FIG. 1 schematically illustrates a backlight module according to an embodiment of the present disclosure.

FIG. 1 schematically illustrates a backlight module 100 according to an embodiment of the present disclosure. The backlight module 100 comprises a light source 110, a micro-mirror array 120 and a control unit (not shown). Light emitted from the light source 100 is reflected by a plurality of micro reflection mirrors in the micro-mirror array 120 to the rear of a display screen 130, thereby providing backlight illumination for a liquid crystal display for example.

A point light source such as a UHP lamp or metal halide lamp may be used as the light source 110. As already known, by virtue of a proper optical path design, divergent light beams emitted from the point light source, after being reflected via the reflection mirror, may cover a larger area, for example, the whole display screen 130.

The micro-mirror array 120 comprises a plurality of micro-mirror units (as represented by a plurality of grilles on the micro-mirror array 120 as shown in FIG. 1). In a default state, all micro reflection mirrors do not deflect and therefore form a planar reflection mirror on the whole. In this case, light reflected by the micro-mirror array 120 may be evenly distributed on the display screen 130 so as to provide even backlight as shown in FIG. 1. However, each micro reflection mirror may deflect about a first axis of deflection and a second axis of deflection perpendicular to the first axis of deflection respectively. As such, the light irradiated by each of the plurality of micro reflection mirrors to the rear of the display screen 130 is adjustable at both a transverse position and a longitudinal position. That is, a distribution state of the intensity of the light reflected by the micro-mirror array 20 on the display screen 130 may be changed to thereby cause uneven backlight. Furthermore, a deflection angle of the reflection mirror in each of the plurality of micro-mirror units may be controlled individually and continuously, not in a discrete manner on a row-by-row or column-by-column basis. In other words, the deflection angle of each reflection mirror may be finely adjusted, and not limited to a fixed value, e.g., ±10°. Hence, the direction of light reflected by the respective micro reflection mirrors may be controlled more flexibly. For example, the backlight may be converged in an individual area (or a plurality of separate areas) on the display screen 130, wherein the backlight with super-high brightness (due to superimposition of the intensity of light reflected by each micro reflection mirror) is provided.

To this end, the backlight module 100 further comprises a control unit (as discussed later) which is used to adjust the deflection angle of the reflection mirror in each of the plurality of micro-mirror units in response to a backlight control signal (e.g., from the display panel).

Figure 2:
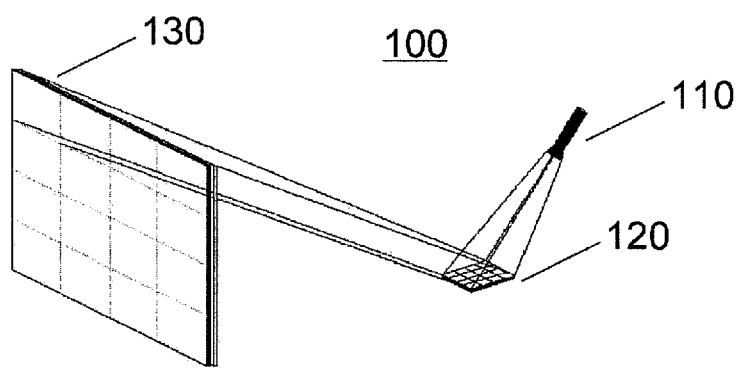
FIG. 2 schematically illustrates an operation state of using the backlight module shown in FIG. 1 to provide uneven backlight.

FIG. 2 schematically illustrates an operation state of using the backlight module 100 shown in FIG. 1 to provide uneven backlight. As stated above, depending on the backlight control signal, the micro-mirror array 120 may reflect light emitted from the light source 110 evenly to an entire surface of the display screen 130 or converge the light to one or more areas (an area as shown in FIG. 2) of the display screen 130.

The micro-mirror array used in the embodiments of the present disclosure will be described in detail below. As already known, the micro-mirror array may comprise deformable type micro-mirror array and deflection-type micro-mirror array according to their working principles, and may comprise thermally-driven micro-mirror array, electromagnetically-driven micro-mirror array and electrostatically-driven micro-mirror array according to their driving mode. Generally, the deflection type micro-mirror array facilitates control of the direction of the light therein, and the electrostatically-driven micro-mirror array is most commonly used.

Figure 3A:
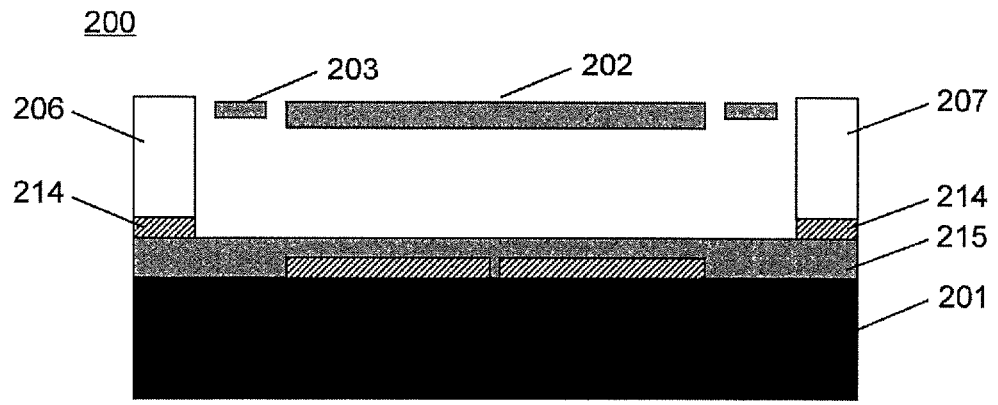
FIGS. 3(a) and 3(b) respectively schematically illustrate a sectional view and a top view of a micro-mirror unit in an electrostatically-driven deflection type micro-mirror array according to an embodiment of the present disclosure.
Figure 3B:
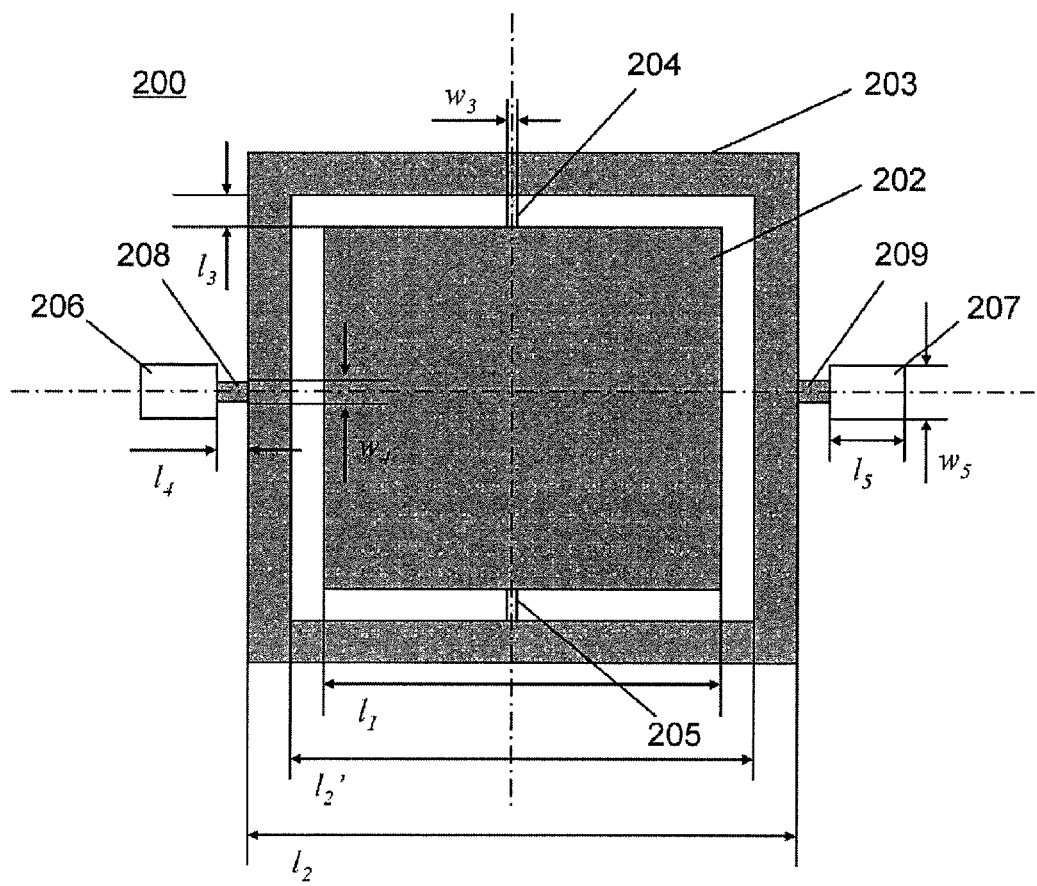
Figure 3C:
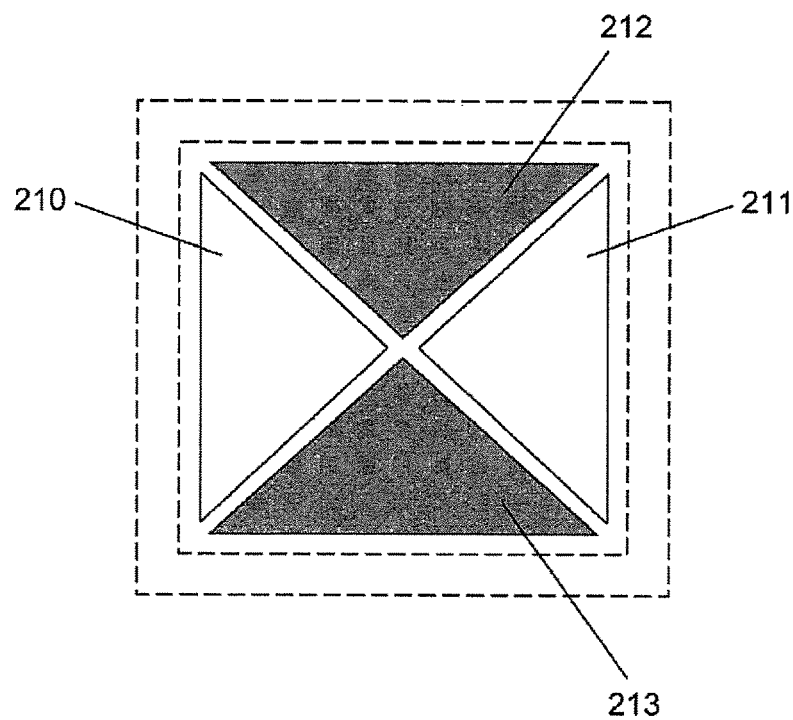
FIG. 3(c) schematically illustrates a top view of a structure of a first electrode pair and a second electrode pair of the micro-mirror unit.

FIGS. 3(a) and 3(b) respectively schematically illustrates a sectional view and a top view of a micro-mirror unit 200 in an electrostatically-driven deflection type micro-mirror array according to an embodiment of the present disclosure; FIG. 3(c) schematically illustrates a top view of a structure of a first electrode pair and a second electrode pair of the micro-mirror unit 200.

The micro-mirror unit 200 is formed on a substrate 201 and comprises a reflection mirror 202, a frame 203, a first hinge 204 and a second hinge 205, a first pillar 206 and a second pillar 207, a third hinge 208 and a fourth hinge 209, a first drive electrode 210 and a second drive electrode 211, a third drive electrode 212 and a fourth drive electrode 213 and a reflection mirror electrode 214.

The reflection mirror 202 is deflectable about the first axis of deflection and the second axis of deflection perpendicular to the first axis of deflection, wherein the first axis of deflection is defined by the first hinge 204 and the second hinge 205, and the second axis of deflection is defined by the third hinge 208 and the fourth hinge 209. The frame 203 supports the reflection mirror 202 by virtue of the first hinge 204 and the second hinge 205, and furthermore, the first pillar 206 and the second pillar 207 support the frame 203 by virtue of the third hinge 208 and the fourth hinge 209 respectively.

The first electrode pair formed by the first drive electrode 210 and the second drive electrode 211 may be formed on the substrate 201, wherein the first drive electrode 210 and the second drive electrode 211 are symmetrical about the projection of the first axis of deflection on the substrate 201. The second electrode pair formed by the third drive electrode 212 and the fourth drive electrode 213 may be formed on the substrate 201, wherein the third drive electrode 212 and the fourth drive electrode 213 are symmetrical about the projection of the second axis of deflection on the substrate 201. The reflection mirror electrode 214 is electrically connected with the reflection mirror 202 via the first pillar 206 and the second pillar 207. Besides, as shown in FIG. 3(a), the substrate 201 may be covered with an insulating layer 215, which provide insulation between the drive electrodes 210, 211, 212 and 213 and the reflection mirror electrode 214. The reflection mirror electrode 214 may be formed on the insulting layer 215. In other words, the drive electrodes 210, 211, 212, 213 and the reflection mirror electrode 214 may be formed on different electrode layers.

By applying respective drive voltages to the first electrode pair and the reflection mirror electrode 214 respectively, an electrostatic field formed between the first electrode pair and the reflection mirror 202 may generate a driving torque which may drive the reflection mirror 202 to deflect about the first axis of deflection. For example, a voltage Vr may be applied to the reflection mirror electrode 214, and voltage $\alpha \cdot Vr$ and voltage $-\alpha \cdot Vr$ may be applied to the first drive electrode 210 and the second drive electrode 211 respectively, wherein a is a coefficient for controlling the deflection angle about the first axis of deflection. Likewise, by applying respective drive voltages to the second electrode pair and the reflection mirror electrode 214 respectively, an electrostatic field between the second electrode pair and the reflection mirror 202 may generate a driving torque which may drive the reflection mirror 202 to deflect about the second axis of deflection. For example, voltage $\beta \cdot Vr$ and voltage $-\beta \cdot Vr$ may be applied to the third drive electrode 212 and the fourth drive electrode 213 respectively, wherein $\beta$ is a coefficient for controlling the deflection angle about the second axis of deflection. Besides, the first electrode pairs and the second electrode pairs in different micro-mirror units 200 may have their respective electrode lead wires, so that different drive voltages may be applied to the drive electrodes of different micro-mirror units 200. In other words, a deflection angle of each reflection mirror 202 in the micro-mirror array may be controlled individually and continuously. Besides, in some cases, undesired sudden changes might happen to the drive voltages, causing too large deflection angle of the reflection mirror 202 and therefore causing damages thereto. Therefore, it is favorable to provide guard electrodes which may be arranged surrounding the first electrode pair and the second electrode pair (as shown by dotted lines in FIG. 3(c)), and which may be applied the same drive voltage as the reflection mirror electrode 214. The guard electrodes may be or may not be located in the same electrode layer as the drive electrodes 210, 211, 212, 213. In an embodiment, the guard electrodes are formed on the insulating layer 215.

In this way, the plurality of micro-mirror units 200 are arranged on the substrate 201 to form a micro-mirror array. As shown in FIG. 3(b), the reflection mirror 202 may be a square, which, as compared with a circular, facilitates better use of the area between micro-mirror units 200 and thereby increases an effective reflection area. Certainly, other shapes are also possible. The substrate 201 is usually made of a semiconductor silicon material because this material has excellent stability and is easy to be processed. The reflection mirror 202 may be fabricated from monocrystalline silicon, polycrystalline silicon or aluminum, wherein aluminum has the highest reflection coefficient which causes a high optical efficiency.

A manufacturing process of the micro-mirror array according to the embodiment of the present disclosure will be described hereunder with reference to an exemplary design as shown in FIG. 3(a).

(1) Depositing a metallic film on a silicon substrate to form a drive electrode layer;

(2) Forming an insulating layer by employing for example Plasma Enhanced Chemical Vapor Deposition (PECVD);

(3) Depositing a metallic film on the insulating layer to form a reflection mirror electrode layer (and optionally a guard electrode layer);

(4) Spin-coating a non-photosensitive polyimide as a sacrificial layer, photoetching the sacrificial layer and wet-etching therein to form grooves for accommodating pillars to be deposited;

(5) Filling nickel in the grooves by electroless plating to form pillars for supporting the reflection mirror (and more specifically the frame) and providing electrical connection between the reflection mirror and the reflection mirror electrode;

(6) Spin-coating a photoresist on the sacrificial layer to photoetch patterns of the first, second, third and fourth hinges and the frame, and depositing aluminum to form hinge and frame layer; then spin-coating a photoresist to photoetch a reflection mirror pattern, and depositing aluminum to form a reflection mirror layer;

(7) Releasing the polyimide sacrificial layer to obtain a deflection type micro-mirror array.

Depending on specific design requirements, a predetermined number (e.g., 32×48) of micro-mirror units 200 may be fabricated on a silicon substrate in an array form. In an example shown in FIG. 3(*b*), parameters of the micro-mirror unit 200 may be as follows:

The square reflection mirror 202 has a side length $l_1$ 60 μm, a thickness 650 nm;

The (hollow) square frame 203 has an outer side length $l_2$ 88 μm, an inner side length $l_2'$ 72 μm, and a thickness 150 nm;

The first hinge 204 and the second hinge 205 each has a length $l_3$ 6 μm, a width $w_3$ 4 μm, and a thickness 150 nm;

The third hinge 208 and the fourth hinge 209 each has a length $l_4$ 8 μm, a width $w_4$ 6 μm, and a thickness 150 nm;

The first pillar 206 and the second pillar 207 each has a length $l_5$ 16 μm, a width $w_5$ 12 μm, and a height 10 μm.

A maximum deflection angle of such reflection mirror 202 is about ±18 degrees. It should be appreciated that if necessary, an allowable maximum deflection angle of the reflection mirror 202 may be changed by changing the heights of the first pillar 206 and the second pillar 207.

To drive each of the reflection mirrors 202 in the micro-mirror array to deflect a certain angle, the backlight module further comprises a control unit (not shown), which comprises a deflection angle determining unit, an angle-drive voltage converting unit and a micro-mirror array driver.

Figure 4:
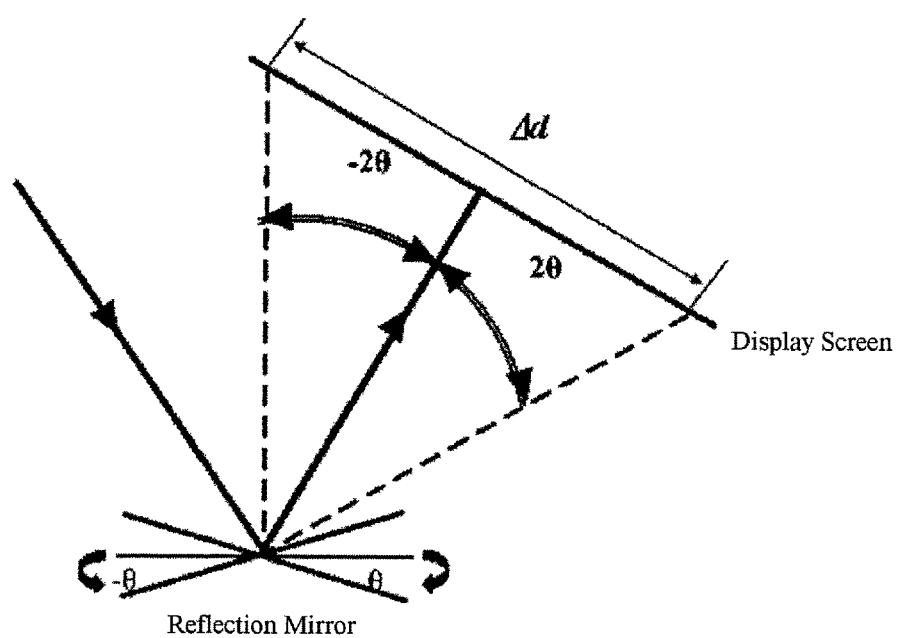
FIG. 4 schematically illustrates a backlight direction adjustment principle used for the backlight module according to an embodiment of the present disclosure.

FIG. 4 schematically illustrates a backlight direction adjustment principle used for the backlight module according to an embodiment of the present disclosure. In a default state, the micro-mirror array reflects light emitted from the light source evenly to the display screen, and each reflection mirror has a corresponding area on the display screen. Upon receiving (e.g., from the display panel) a backlight control signal indicative of a target area to be illuminated on the display screen, the deflection angle determining unit may determine a deflection angle for each reflection mirror according to a positional relationship between a currently-illuminated area and the target illumination area. The determination is based on light reflection principle as shown in FIG. 4. As shown in the figure, in the case that the reflection mirror deflects by ±θ, the light reflected to the display screen may move at most Δd. For illustration purpose, FIG. 4 only shows the case that the reflection mirror deflects about one axis of deflection. However, the deflection angle determined by the deflection angle determining unit may comprise a first deflection component with respect to the first axis of deflection and a second deflection component with respect to the second axis of deflection. The angle-drive voltage converting unit converts the respective first deflection component and the respective second deflection component for each reflection mirror respectively into drive voltage values for driving the first electrode pair and the second electrode pair corresponding to the reflection mirror. The micro-mirror array driver applies respective drive voltages to the first electrode pair and second electrode pair corresponding to each reflection mirror according to the converted drive voltage values.

Specifically, the same reference voltage Vr may be applied to all reflection mirror electrodes in the micro-mirror array. In each micro-mirror unit of the micro-mirror array, the first drive electrode is applied a first drive voltage (α·Vr), whereas the second drive electrode is applied a drive voltage (−α·Vr) in an opposite phase to the first drive voltage. The first drive voltage, as a function of the first deflection component, is proportional to the reference voltage Vr. Similarly, the third drive electrode is applied a second drive voltage (β·Vr), whereas the fourth drive electrode is applied a drive voltage (−β·Vr) in an opposite phase to the second drive voltage. The second drive voltage, as a function of the second deflection component, is proportional to the reference voltage Vr. α and β are coefficients for controlling the deflection angles of the reflection mirror about the first axis of deflection and second axis of deflection respectively. In an example, α and β may be between 0.1 and 0.9.

To this end, the micro-mirror array driver may comprise a plurality of digital-analog converters and a plurality of voltage inverters. The digital-analog converter, according to a drive voltage value converted by the angle-drive voltage converting unit, outputs an analog voltage to be applied to a drive electrode, and the voltage inverter is used to invert the analog voltage output by the digital-analog converter. The implementations of the digital-analog converter and voltage inverter are already known in the art. Each of the micro-mirror units has respective two digital-analog converters and respective two voltage inverters. One of the two digital-analog converters provides the first drive voltage (α·Vr) for the first drive electrode, and the other provides the second drive voltage (β·Vr) for the third drive electrode. One of the two voltage inverters provides the second drive electrode with the drive voltage (−α·Vr) in an opposite phase to the first drive voltage, and the other provides the fourth drive electrode with the drive voltage (−β·Vr) in an opposite phase to the second drive voltage.

In the preceding embodiments, the backlight direction adjustment principle is described with respect to the electrostatically-driven deflection type micro-mirror array. It should be appreciated that the principle also applies to any micro-mirror array using other drive manners, so long as each reflection mirror in the micro-mirror array has two axes of deflection which are perpendicular to each other, and its deflection angle is controlled individually and continuously.

Now other components in the backlight module according to the embodiment of the present disclosure are discussed. In the preceding description, the light source 110 is described as a point light source. However, a direction of light emitted by the point light source is disorderly and does not facilitate improvement of the optical efficiency. In another embodiment, the light source in the backlight module may be a parallel light source. As already known, the parallel light source may be provided by a combination of a point light source (UHP, LED etc.) and a convex lens (and possibly a reflection cover, a light-converging column and the like). As such, in the default state, light irradiated to the reflection mirror and light reflected from the reflection mirror are both parallel light, so that an area of the display screen that can be illuminated by the reflected light provided by the micro-mirror array is smaller because a size of the micro-mirror array is smaller (and therefore, the reflection area is smaller). Hence, the backlight module may further comprise a projection lens.

Figure 5:
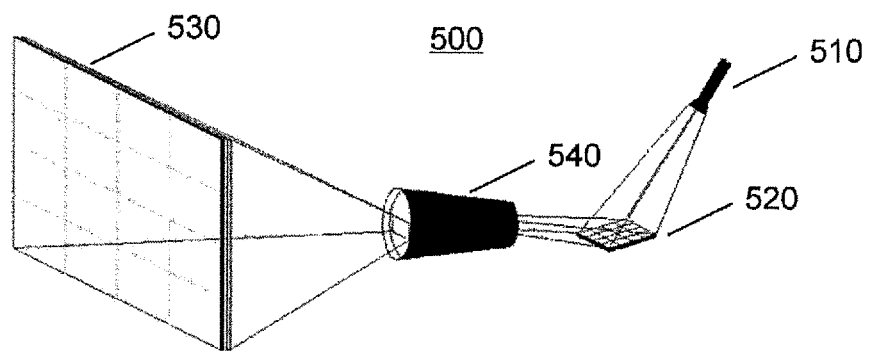
FIG. 5 schematically illustrates a backlight module according to another embodiment of the present disclosure.

FIG. 5 schematically illustrates a backlight module 500 according to another embodiment of the present disclosure. Different from the backlight module 100 shown in FIG. 1, the backlight module 500 has a light source 510 as a parallel light source, and further comprises a projection lens 540. In this case, the projection lens 540 is arranged on a reflection optical path of the micro-mirror array 520 to diverge the reflected light from the micro-mirror array 520 to match the size of the display screen 530. Certainly, in the case that the light source is a point light source (as shown in FIG. 1), the backlight module 100 may also comprise a projection lens. Due to divergence of light performed by the projection lens, the reflection optical path may be substantially reduced, thereby causing reduction of the size of the backlight module. Besides, the projection lens may further correct distortion of the reflected light.

In either case, the backlight module 100, 500 may further comprise a light-scattering plate (not shown), which may be arranged on a rear side of the display screen 130, 530 to improve properties of light finally irradiated to the display screen, e.g., provide even brightness.

According to an aspect of the present disclosure, there is further provided a display device comprising any one of the above-mentioned backlight modules 100, 500. In an exemplary manner, the display device may be a liquid crystal display, a liquid crystal television set, a digital photo frame, a digital camera, a mobile phone, a flat panel computer or any other product or component having a liquid crystal display device.

Those skilled in the art will recognize that the control unit described in conjunction with embodiments disclosed herein may be implemented as electronic hardware or a combination of electronic hardware and computer software. Some of embodiments and implementations are described above according to by means of and/or modules and various processing steps. However, it should be appreciated that such functions or modules may be implemented by any number of hardware, software and/or firmware components which are configured to perform specific functions. Whether such functions are implemented as hardware or software depends on a specific application and design constraints imposed on an overall system. Skilled artisans may implement the described functionality in various ways for each specific application, but such implementation should not be interpreted as causing a departure from the scope of the present disclosure. For example, an embodiment of the control unit may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments described herein are merely exemplary implementations.

While several specific implementation details are described above, these should not be construed as limitations on the scope of any disclosure or of what may be claimed, but rather as descriptions of features that may be specific to particular embodiments of particular disclosures. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excluded from the combination, and the claimed combination may be directed to a sub-combination or variation of a sub-combination.

Therefore, it is to be understood that the embodiments of the disclosure are not to be limited to the specific embodiments disclosed and that modifications and other embodiments are intended to be included within the scope of the appended claims. Although specific terms are used herein, they are used in a generic and descriptive sense only and not for purposes of limitation.

The invention claimed is:

1. An electrostatically-driven deflection type micro-mirror array, comprising:
    a substrate; and
    a plurality of micro-mirror units formed on the substrate, each of the plurality of micro-mirror units comprising:
        a reflection mirror deflectable about a first axis of deflection and a second axis of deflection perpendicular to the first axis of deflection;
        a frame supporting the reflection mirror by virtue of a first hinge and a second hinge, the first hinge and the second hinge defining the first axis of deflection;
        a first pillar and a second pillar supporting the frame via a third hinge and a fourth hinge respectively, the third hinge and the fourth hinge defining the second axis of deflection, the third hinge being located at the first pillar and the fourth hinge being located at the second pillar;
        a first electrode pair comprising a first drive electrode and a second drive electrode, the first drive electrode and the second drive electrode being symmetrical about the projection of the first axis of deflection on the substrate;
        a second electrode pair comprising a third drive electrode and a fourth drive electrode, the third drive electrode and the fourth drive electrode being symmetrical about the projection of the second axis of deflection on the substrate wherein the first drive electrode, the second drive electrode, the third drive electrode and the fourth drive electrode are physically separate from each other; and
        a reflection mirror electrode electrically connected with the reflection mirror via the first pillar and the second pillar, wherein the first pillar and the second pillar form a portion of an electrical path between the reflection mirror electrode and the reflection mirror;
    wherein an electrostatic field formed between the first electrode pair and the reflection mirror enables the reflection mirror to deflect about the first axis of deflection, and an electrostatic field formed between the second electrode pair and the reflection mirror enables the reflection mirror to deflect about the second axis of deflection;
    wherein a deflection angle of the reflection mirror of each of the plurality of micro-mirror units is controlled individually and continuously.

2. The micro-mirror array according to claim 1, further comprising an insulating layer formed on the substrate and providing insulation between the reflection mirror electrode and the first electrode pair and the second electrode pair.

3. The micro-mirror array according to claim 2, wherein each of the plurality of micro-mirror units further comprises guard electrodes arranged surrounding the first electrode pair and the second electrode pair, the guard electrodes and the reflection mirror electrode being applied a same drive voltage.

4. The micro-mirror array according to claim 1, wherein the reflection mirror, the first, second, third and fourth hinges and the frame are integrally formed of aluminum.

5. The micro-mirror array according to claim 1, wherein the reflection mirror is in a shape of a square.

* * * * *